United States Patent
Tsuyama (10) Patent No.: US 7,599,140 B2
(45) Date of Patent: Oct. 6, 2009

(54) OUTPUT CONTROL DEVICE AND RECORDING-MEDIUM-DRIVER CONTROL DEVICE

(75) Inventor: Isao Tsuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 140 days.

(21) Appl. No.: 11/439,158

(22) Filed: May 23, 2006

(65) Prior Publication Data
US 2007/0188904 A1 Aug. 16, 2007

(30) Foreign Application Priority Data
Feb. 16, 2006 (JP) .............................. 2006-039872

(51) Int. Cl.
*G11B 5/09* (2006.01)
(52) U.S. Cl. .................... 360/51; 360/53; 360/77.02
(58) Field of Classification Search ................. None
See application file for complete search history.

(56) References Cited

U.S. PATENT DOCUMENTS

| | | | | |
|---|---|---|---|---|
| 3,562,661 A | * | 2/1971 | Crumbs et al. ................ 331/10 |
| 5,193,035 A | * | 3/1993 | Kanota et al. ................. 360/51 |
| 5,327,300 A | * | 7/1994 | Satomura ..................... 360/51 |
| 5,526,332 A | * | 6/1996 | Yamada et al. ............ 369/47.35 |
| 5,535,067 A | * | 7/1996 | Rooke ......................... 360/51 |
| 5,568,201 A | * | 10/1996 | Matsumoto ................. 348/500 |
| 5,739,708 A | * | 4/1998 | LeWalter .................... 327/143 |
| 5,852,632 A | * | 12/1998 | Capici et al. ................ 375/238 |
| 5,854,717 A | * | 12/1998 | Minuhin ....................... 360/65 |
| 5,945,856 A | * | 8/1999 | Yanagiuchi .................. 327/159 |
| 6,023,771 A | * | 2/2000 | Watanabe .................... 713/501 |
| 6,085,327 A | * | 7/2000 | Seng et al. ................... 713/300 |
| 6,178,057 B1 | * | 1/2001 | Kuroda et al. ................. 360/51 |
| 6,222,692 B1 | * | 4/2001 | Shrinkle ...................... 360/51 |
| 6,265,916 B1 | * | 7/2001 | Ono et al. ................... 327/116 |
| 6,603,361 B1 | * | 8/2003 | Carobolante ................. 331/25 |
| 6,731,708 B1 | * | 5/2004 | Watanabe .................... 375/357 |
| 6,744,328 B2 | * | 6/2004 | Magoon et al. .............. 331/183 |
| 7,088,534 B2 | * | 8/2006 | Sutardja ....................... 360/51 |
| 7,119,475 B2 | * | 10/2006 | Matsuzaki et al. ..... 310/316.01 |
| 7,228,445 B2 | * | 6/2007 | Yamashita et al. .......... 713/322 |
| 2004/0027171 A1 | * | 2/2004 | Matsumoto et al. ........... 327/77 |
| 2004/0073826 A1 | * | 4/2004 | Yamashita et al. .......... 713/323 |
| 2004/0160285 A1 | * | 8/2004 | Lovelace et al. ............ 331/183 |
| 2005/0180280 A1 | * | 8/2005 | Hoshino et al. ............. 369/47.5 |
| 2006/0139104 A1 | * | 6/2006 | Stevenson et al. ............. 331/16 |

FOREIGN PATENT DOCUMENTS

| | | |
|---|---|---|
| JP | 57-111759 | 7/1982 |
| JP | 5-109091 | 4/1993 |

* cited by examiner

*Primary Examiner*—William J Klimowicz
*Assistant Examiner*—Dismery E Mercedes
(74) *Attorney, Agent, or Firm*—Greer, Burns & Crain, Ltd.

(57) ABSTRACT

A determining unit determines whether a clock signal is oscillated with an oscillation amplitude equal to or greater than a predetermined value. An output control unit outputs the clock signal to an output destination when the determining unit determines that the clock signal is oscillated with the oscillation amplitude equal to or greater than the predetermined value.

12 Claims, 8 Drawing Sheets

OUTPUT CONTROL DEVICE AND RECORDING-MEDIUM-DRIVER CONTROL DEVICE

BACKGROUND OF THE INVENTION

1. Field of the Invention

The present invention relates to a technology for controlling an output of a clock signal generated by an oscillator.

2. Description of the Related Art

Conventionally, a hard disk controller ("HDC") built in a hard disk drive ("HDD") controls the HDD by using a clock signal output from an oscillator built in the HDD. The HDC starts receiving the clock signal after a predetermined time elapses since a time when a power supply to the HDD is started, and controls the HDD based on the clock signal.

There is a lapse between the time when the power supply to the HDD is started and the clock signal is received by the HDC because the clock signal output by the oscillator immediately after the power supply to the HDD is started tends to be unstable and if the HDC controls the HDD using the unstable clock signal, HDC is likely to malfunction leading to a failure of the HDD.

Japanese Patent Laid-Open Publication No S57-111759 discloses a technology in which when the HDC outputs a write instruction to the HDD, any error in data forwarding is detected by detecting the presence or absence of a write clock output from the HDC.

However, in the conventional technology, in some situations, the clock signals output from the oscillator tend to be unstable even after some time has elapsed since the time the power supply to the HDD is started, and thus is found to be inadequate as a measure against HDD failure.

A method of controlling the HDD by receiving the clock signal after sufficiently delaying the timing at which the HDC retrieves the clock signal output from the oscillator can be considered. However, in this method, the initiation time of the HDD will also get delayed and therefore would not be useful.

SUMMARY OF THE INVENTION

It is an object of the present invention to at least partially solve the problems in the conventional technology.

An output control device according to one aspect of the present invention controls an output of a clock signal generated by an oscillator. The output control device includes a determining unit that determines whether the clock signal is oscillated with an oscillation amplitude equal to or greater than a predetermined value; and an output control unit that outputs the clock signal to an output destination when the determining unit determines that the clock signal is oscillated with the oscillation amplitude equal to or greater than the predetermined value.

A method according to another aspect of the present invention is for controlling an output of a clock signal generated by an oscillator. The method includes determining whether the clock signal is oscillated with an oscillation amplitude equal to or greater than a predetermined value; and outputting the clock signal to an output destination when the determining unit determines that the clock signal is oscillated with the oscillation amplitude equal to or greater than the predetermined value.

A recording-medium-driver control device comprising: according to still another aspect of the present invention includes a determining unit that determines whether the clock signal is oscillated with an oscillation amplitude equal to or greater than a predetermined value; an output control unit that outputs the clock signal to an output destination when the determining unit determines that the clock signal is oscillated with the oscillation amplitude equal to or greater than the predetermined value, and suspends the output of the clock signal to the output destination when the determining unit determines that the clock signal is not oscillated with the oscillation amplitude equal to or greater than the predetermined value; and a recording-medium-driver control unit that is controlled by the clock signal output from the output control unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained below in detail with reference to the accompanying drawings.

Figure 8:
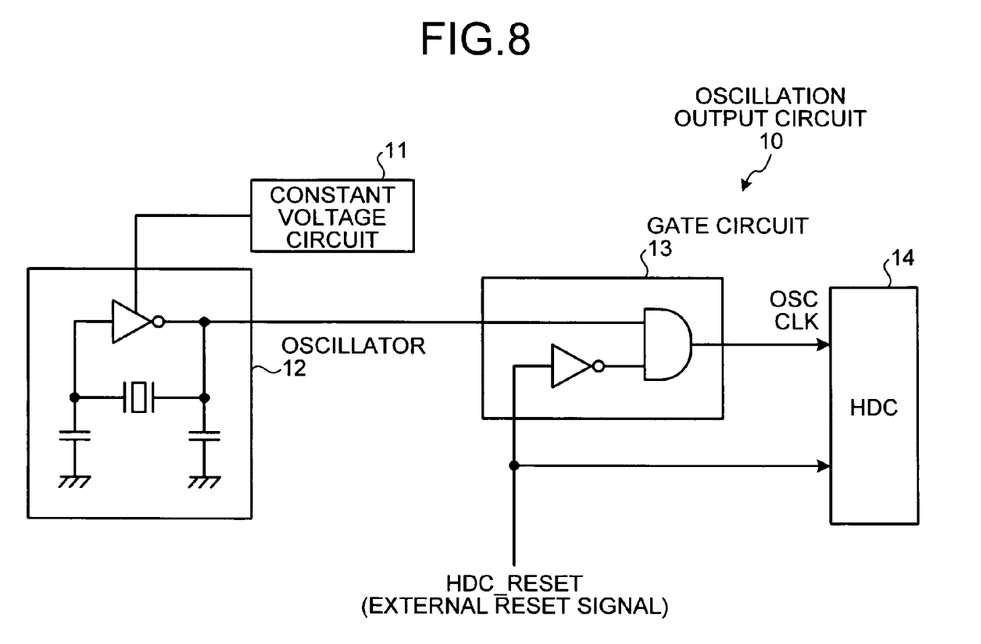
FIG. 8 is a functional block diagram of a conventional oscillation output circuit of the HDD.

FIG. 8 is a functional block diagram of an oscillation output circuit 10 according to a conventional technology. The oscillation output circuit 10 includes a constant voltage circuit 11, an oscillator 12, a gate circuit 13, and an HDC 14.

The constant voltage circuit 11 applies a constant voltage (for example, 0 V to 2 V) on the oscillator. The oscillator uses the voltage applied by the constant voltage circuit 11 and generates clock signals (for example, clock signals having an oscillation amplitude of +/−1 V with respect to 1 V if the constant voltage circuit 11 applies a voltage of 0 to 2 V) and outputs the generated clock signals to the gate circuit 13. The oscillator 12 includes an oscillation device, such as a crystal oscillator, and an amplifier, and oscillates by positive feedback amplification to generate clock signals.

The gate circuit 13 adjusts the timing at which the clock signals are input into the HDC 14 based on external reset signals (for example, from a power control circuit, etc.) being input. The gate circuit 13 includes an AND circuit and a NOT circuit. When the external reset signals are being input, the gate circuit 13 blocks the clock signals from being input into the HDC 14 from the oscillator 12. When the input of the external reset signals stops, the gate circuit 13 forwards the clock signals output from the oscillator 12 to the DHC 14. The HDC controls the HDD using the clock signals forwarded by the gate circuit 13.

A reset signal controller (not shown) that controls the reset signals from being input into/stopped from being input into the gate circuit 13 stops the reset signals from being input to the gate circuit after a predetermined time has elapsed since the time power supply to the HDD is started, and allows the clock signals being output from the oscillator 12 to be input into the HDC 14, thereby preventing any malfunctioning.

However, if there is an initiation delay of the oscillator 12 due to some reason, the input of the external reset signals may stop long before the clock signals stabilize. Consequently, the HDC 14 will be forced to start functioning based on unstable clock signals, thus increasing the possibility of an HDD failure.

Therefore, according to the present invention, to prevent unstable clock signals from being input into the HDC 14, it is determined before allowing the clock signals to be input into the HDC 14 whether the clock signals being output from the oscillator 12 have attained the oscillation amplitude equal to or greater than a predetermined value, and are allowed to enter the HDC 14 only if they satisfy the condition.

Figure 1:
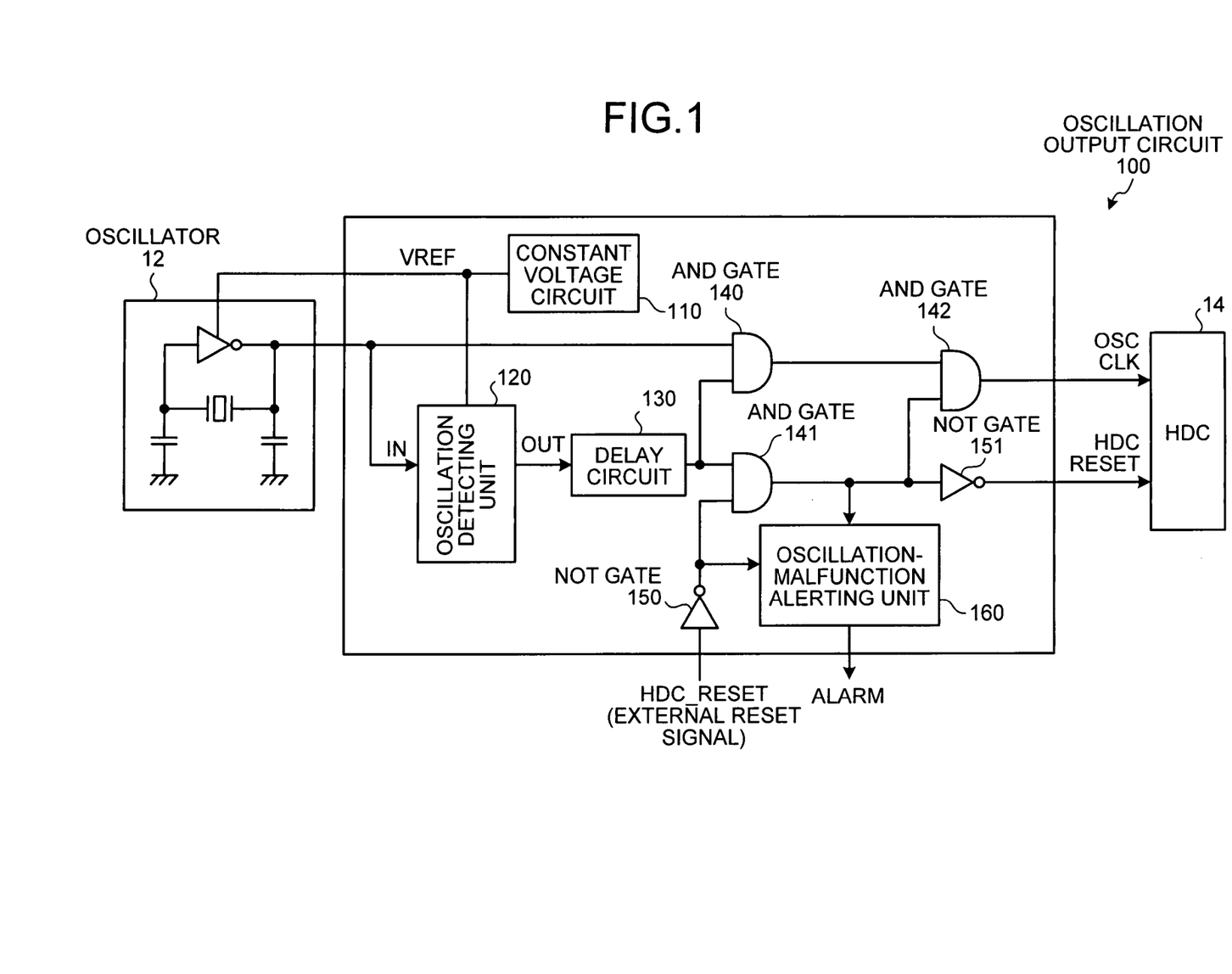
FIG. 1 is a functional block diagram of an oscillation output circuit of an HDD according to a first embodiment of the present invention.

FIG. 1 is a functional block diagram of an oscillation output circuit 100 according to a first embodiment of the present invention. The oscillation output circuit 100 includes the oscillator 12, the HDC 14, a constant voltage circuit 110, an oscillation detecting unit 120, a delay circuit 130, AND gates 140 through 142, NOT gates 150 and 151, and an oscillation-malfunction alerting unit 160. The parts in FIG. 1 that are identical to those in FIG. 8 have been assigned the same reference numerals and have not been described again.

The constant voltage circuit 110 limits the oscillation amplitude of the voltage to a constant value, and applies a voltage (VREF) having a limited amplitude on the oscillator 12 and the oscillation detecting unit 120.

The oscillation detecting unit 120 determines whether the clock signals output from the oscillator 12 have attained an oscillation amplitude equal to or greater than a specified level at a positive end and a negative end. Specifically, if it is determined that the oscillation amplitude of clock signals output from the oscillator 12 is equal to or greater than the specified level at the positive end and the negative end, the oscillation detecting unit 120 sets the output from the oscillation detecting unit 120 as "High", and if it is determined to be less than the specified level, sets the output as "Low".

The delay circuit 130 delays the output from the oscillation detecting unit 120 by a certain period, and forwards the delayed output to the AND gates 140 and 141. The delay period introduced by the delay circuit 130 starts from the time the oscillation detecting unit recognizes that the clock signals have attained the stipulated level and spans the entire duration required for the clock signals to sufficiently stabilize.

The AND gate 140 forwards the clock signals output from the oscillator 12 to the AND gate 142 when the output from the delay circuit 130 is "High" (in the time required for the clock signals to stabilize).

The AND gate 141 outputs a "High" signal to the AND gate 141, the NOT gate 151, and the oscillation-malfunction alerting unit 160 when the output from the delay circuit 130 is "High" and the input of the external reset signals has stopped (when "High" is output from the NOT gate 150).

The AND gate 142 forwards the clock signals (as OSC clock signals) from the oscillator 12 to the HDC 14 when the input of the external reset signals has stopped (when the output from the AND gate 141 is "High") and the clock signals are stable.

That is, as the output of the AND gate 141 does not become "High" when the clock signals are unstable, and the external reset signals are still being input into the HDC 14, the output of the clock signals from the AND gate 142 is held back. Consequently, malfunctioning of the HDC 14 due to input of unstable clock signals is prevented.

The NOT gates 150 and 151 reverses the received signals and forwards the reversed signals. For example, if "High" signals are received, the NOT gates 150 and 151 convert them to "Low" signals, and if "Low" signals are received, the NOT gates 150 and 151 convert them to "High" signals.

The oscillation-malfunction alerting unit 160 determines whether any oscillation malfunction has occurred by the logic of the external reset signals and the oscillation detection signal (output from the AND gate 141) from within. If it is determined that oscillation malfunction has occurred, the oscillation-malfunction alerting unit 160 outputs an alarm. In the first embodiment, as a standard for determining whether oscillation malfunction has occurred, the oscillation-malfunction alerting unit 160 outputs an alarm when the clock signals are not stabilized (when the output from the AND gate 141 is "Low") irrespective of whether input of the external reset signals has stopped (that is, when the output from the NOT gate 150 is "High").

When it is determined that that oscillation malfunction has occurred, apart from outputting an alarm, the oscillation-malfunction alerting unit 160 also restarts the HDD in response to the oscillation malfunction.

Figure 2:
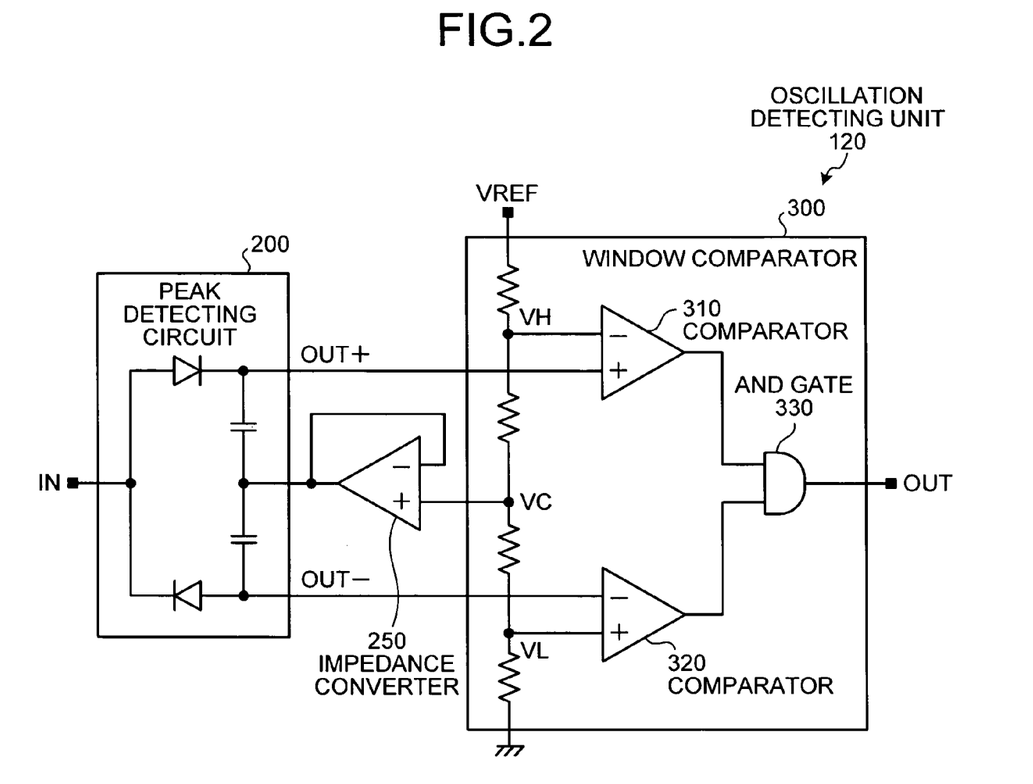
FIG. 2 is a functional block diagram of an oscillation detecting unit.

FIG. 2 is a functional block diagram of the oscillation detecting unit 120. The oscillation detecting unit 120 includes a peak detecting circuit 200, an impedance converter 250, and a window comparator 300.

The peak detecting circuit 200 detects the oscillation level at the positive end (OUT+) and at the negative end (OUT−) with reference to a common potential VC. The impedance converter 250 converts the value of the impedance and supplies a low impedance common potential VC required by the peak detecting circuit 200.

The window comparator 300 outputs a "High" signal when the potential output from the peak detecting circuit 200 at the positive end (OUT+) exceeds a threshold value VH and the potential output from the peak detecting circuit 200 at the negative end (OUT−) is below another threshold value VL. The window comparator 300 includes comparators 310 and 320 and an AND gate 330.

The comparator 310 compares the potential output from the peak detecting circuit 200 at the positive end (OUT+) and the threshold value VH, and if the potential at the positive end (OUT+) is found to exceed the threshold value VH, outputs a "High" signal to the AND gate 330.

The comparator 320 compares the potential output from the peak detecting circuit 200 at the negative end (OUT−) and the threshold value VL, and if the potential at the negative end (OUT−) is found to be below the threshold value VL, outputs a "High" signal to the AND gate 330.

The AND gate 330 outputs a "High" signal when "High" clock signals are output from the comparators 310 and 320. In other words, when a "High" signal is output from the AND gate 330, it indicates that the clock signals have attained the oscillation amplitude equal to or greater than the predetermined value (in other words, indicates that the clock signals are stable). The reference symbol VREF in FIG. 2 represents the stabilized voltage generated by the constant voltage circuit 110. In a steady state, the oscillation amplitude of the signals (clock signals) output from the oscillation output circuit 100, the potentials VH, VL, and VC are all functions of the VREF.

Figure 3:
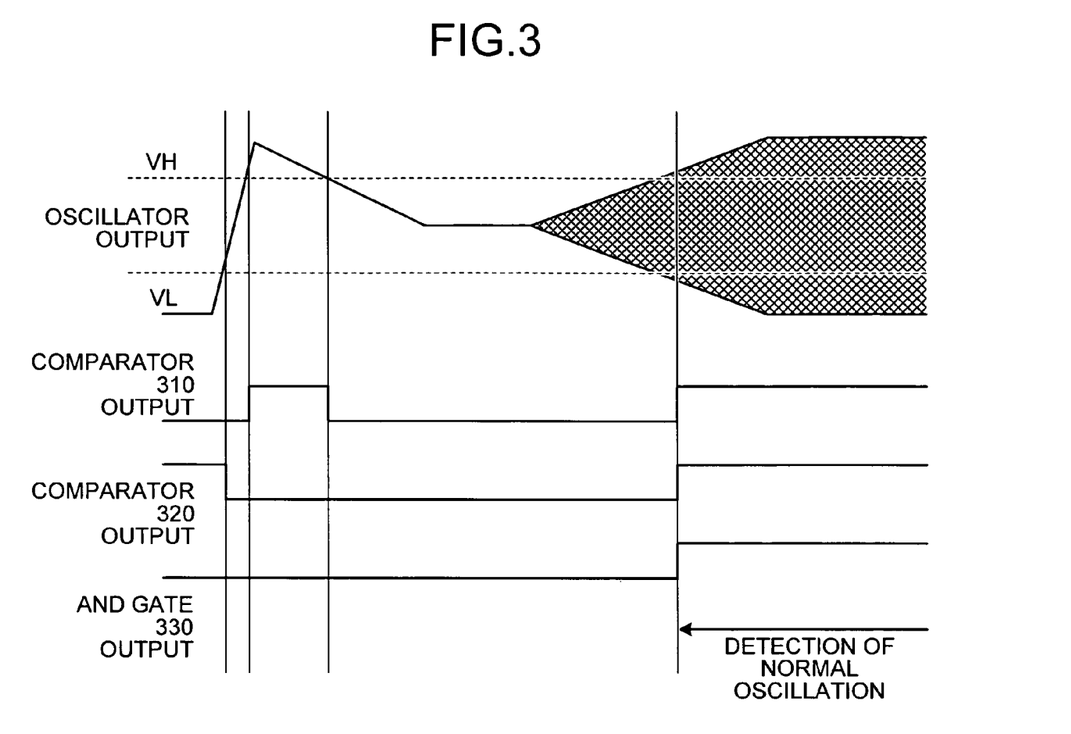
FIG. 3 is a timing chart of oscillation detection.

FIG. 3 is a timing chart of oscillation detection. When the output of the oscillator (input of the oscillation detecting unit 120) exceeds the threshold value VH, the comparator 310 outputs a "High" signal. On the other hand, if the output of the oscillator is below the threshold value VL, the comparator 320 outputs a "High" signal.

Both the comparators 310 and 320 do not simultaneously output "High" signals immediately after the initiation (that is, immediately after power supply to the HDD is started) as the oscillation of the clock signals would not have begun yet and the direct current bias would be transiently fluctuating. In other words, when the direct current bias is transiently fluctuating, the AND gate 330 outputs a "Low" signal. Once the oscillation begins and the oscillation amplitude gradually increases, the oscillation envelope is between the two threshold values VH and VL from a certain point in time. From this point in time, the AND gate 330 starts outputting a "High" signal (that is, determines that the clock signals have attained the oscillation amplitude equal to or greater than the predetermined value).

Figure 4:
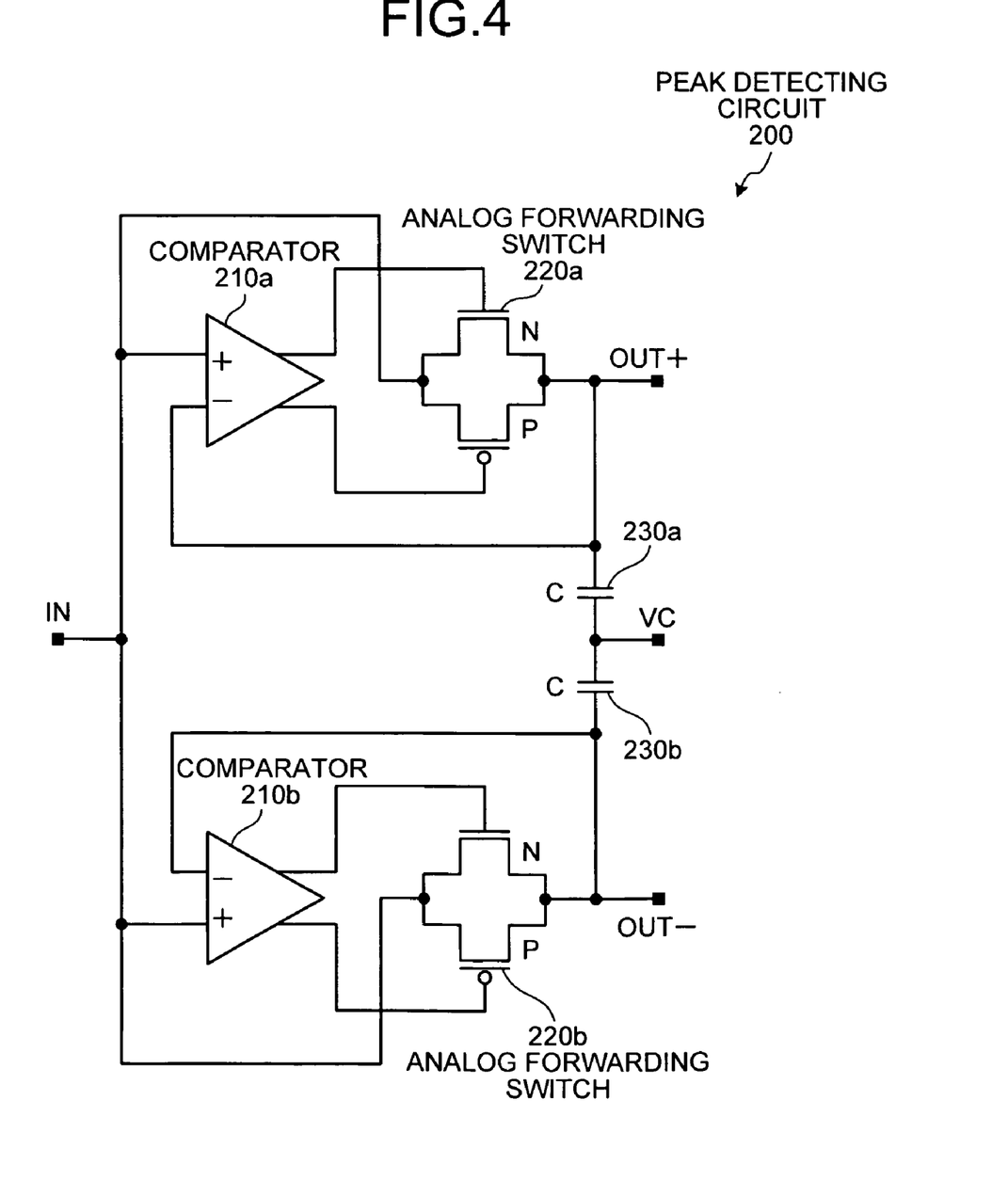
FIG. 4 is a functional block diagram of an analog-SW type peak detecting circuit.

Various types can be adopted for the peak detecting circuit 200, such as analog-SW type, analog-SW+OP-Amp type, to name a few. In the present embodiment, analog-SW type and analog-SW+OP-Amp type are presented as example. FIG. 4 is a functional block diagram of the peak detecting circuit 200 of, the analog-SW type.

The peak detecting circuit 200 includes comparators 210a and 210b, analog forwarding switches 220a and 220b, and condensers 230a and 230b. The comparator 210a compares the input IN (the clock signals from the oscillator 12) and the output OUT+. If the IN potential is found to be higher than the OUT+ potential, the analog forwarding switch 220a becomes ON, and the condenser 230a starts getting charged towards the input IN potential according to a time constant determined by a resistance of the ON status.

Once the condenser 230a is charged to the peak IN potential and charge starts dropping, the analog forwarding switch 220a becomes OFF, and the potential of the condenser 230a is held. The peak detection at the positive end is carried out while repeating the charging and holding the charge of the condenser 230a at each cycle of the clock signals in the input IN. The transient response for a cycle is represented by $$V_{OUT}(0) = V_C \quad (1)$$

$$V_{OUT}(t) = V_{OUT}(n) + (V_{IN} - V_{OUT}(n)) \cdot \left(1 - e^{-\frac{t-n}{C \cdot R_{ON}}}\right) \quad (2)$$

Equation (1) defines the initial potential, and $V_{out}(n)$ in Equation (2) denotes the potential reached up to the previous cycle. In Equation (2), t is the time from which power supply is started, C is the magnitude of charging of the condenser 230a, and $R_{on}$ is the resistance of the ON status of the analog forwarding switch 220a.

The comparator 210b compares the input IN and the output OUT−. If the IN voltage is lower than the OUT− potential, the analog forwarding switch 220b becomes ON, and the condenser 230b starts getting charged towards the input potential according to the time constant determined by the resistance of the ON status.

Once the condenser 230b is charged to the peak IN voltage (negative peak point) and the charge continues to climb, the analog forwarding switch 220b becomes OFF, and the potential of the condenser is held. The peak detection at the negative end is carried out while repeating the charging and holding the charge of the condenser 230b at each cycle of the clock signals in the input IN. The transient response of a cycle at the negative end is also represented by Equations (1) and (2) given above.

Figure 5:
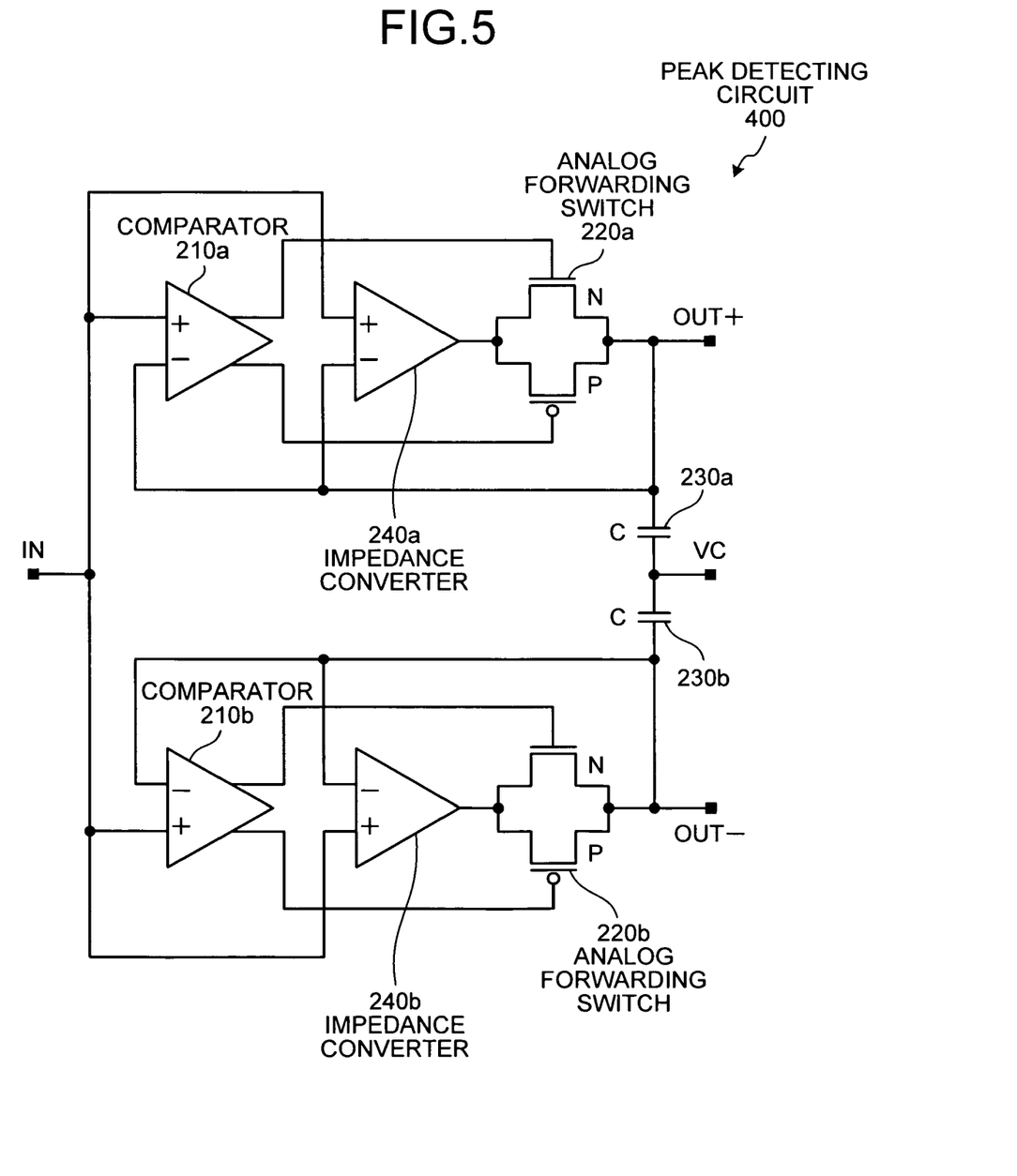
FIG. 5 is a functional block diagram of an analog-SW-OP-Amp type peak detecting circuit.

FIG. 5 is a functional block diagram of a peak detecting circuit 400 of the analog-SW+OP-Amp type. The peak detecting circuit 400 includes the comparators 210a and 210b, the analog forwarding switches 220a and 220b, the condensers 230a and 230b, and impedance converters 240a and 240b. The parts in FIG. 5 that are identical to those in FIG. 4 have been assigned the same reference numerals and are not explained again.

The impedance converter 240a functions as a buffer that prevents changing of the charge characteristics of the condenser 230a when the analog forwarding switch 220a becomes ON. The impedance converter 240b functions as a buffer that prevents changing of the charge characteristics of the condenser 230b when the analog forwarding switch 220b becomes ON. Thus, incorporating the impedance converters 240a and 240b in the peak detecting circuit 400 enables adjustment of the charge characteristics of the condensers 230a and 230b can, thereby increasing the degree of freedom when designing the oscillation detecting unit 120.

Thus, in the oscillation output circuit 100 according to the first embodiment, when the oscillator 12 outputs clock signals after the power supply to the HDD is started, the oscillation detecting unit 120 determines whether the clock signals have attained the oscillation amplitude equal to or greater than a predetermined value, and if found to have attained the oscillation amplitude equal to or greater than the predetermined value, outputs a "High" signal and outputs the clock signals from the oscillator 12 to the HDC 14. Consequently, the HDC 14 controls the HDD using stable clock signals, thus eliminating the possibility of occurrence of any failure of the HDD.

The oscillation output circuit 100 according the first embodiment includes the delay circuit 130, which outputs the clock signals to the HDC 14 after a predetermined time has elapsed since the time it is determined by the oscillation detecting unit 120 that the clock signals are normal. Consequently, the HDC 14 can control the HDD using clock signals that are more reliably normal.

The oscillation output circuit 100 according to the first embodiment includes the oscillation-malfunction alerting unit 160, which outputs an alarm when the clock signals are not stabilized irrespective of whether the input of the external reset signals has stopped. Consequently, the administrator quickly comes to know that HDD is malfunctioning allowing him/her to restart the HDD without delay. Specifically, when the oscillation-malfunction alerting unit 160 outputs the alarm, the control circuit of the HDD instructs all the circuits to notify that the host needs to be restarted by causing the power LED to blink. Alternatively, control can be realized in such a way that the alarm output by the oscillation-malfunction alerting unit 160 is input to a power control circuit (not shown), and the HDD is automatically restarted.

According to the first embodiment, the oscillation detecting unit 120 retrieves the clock signals immediately after the power supply to the HDD is started, and determines whether the clock signals have attained the oscillation amplitude equal to or greater than a predetermined value. However, the oscillation detecting unit 120 can also be made to retrieve the clock signals from the oscillator 12 continuously when the HDD is functioning, and if the clock signals are found to be less than the predetermined oscillation amplitude, switch the output from the oscillation detecting unit 120 from "High" to "Low", and stop the output of the clock signals to the HDC 14.

Thus, the oscillation detecting unit 120 constantly monitors the clock signals being output from the oscillator 12, and upon detecting any abnormality, stops the output of the clock signals to the HDC 14, as a result resolving the problem of HDD failure due to malfunctioning of the HDC 14 due to unstable clock signals produced by some factor.

Figure 6:
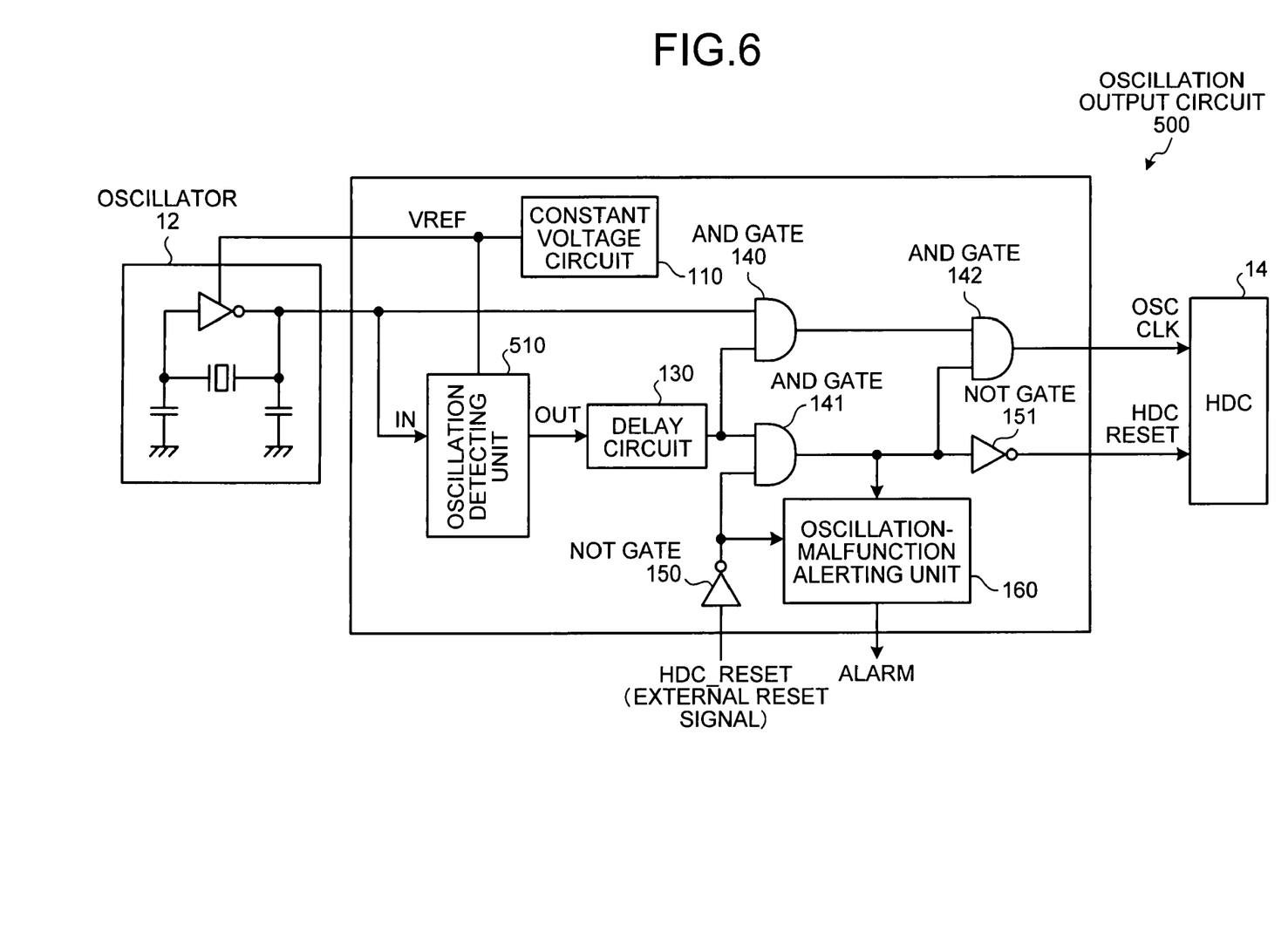
FIG. 6 is a functional block diagram of an oscillation output circuit according to a second embodiment of the present invention.

An oscillation output circuit 500 according to a second embodiment of the present invention keeps a count of the number of times the clock signals output from the oscillator attain the oscillation amplitude equal to or greater than the predetermined value, and outputs the clock signals to the HDC if the count exceeds a predetermined value. Thus, the problem of HDD failure due to malfunctioning of the HDC 14 due to input of unstable clock signals is addressed.

FIG. 6 is a functional block diagram of the oscillation output circuit 500 according to the second embodiment. The oscillation output circuit 500 includes the oscillator 12, the HDC 14, the constant voltage circuit 110, an oscillation detecting unit 510, the delay circuit 130, the AND gates 140 through 142, the NOT gates 150 and 151, and the oscillation-malfunction alerting unit 160. The parts in FIG. 6 that are identical to the ones in FIG. 1 have been assigned the same reference numeral and are not described again.

The oscillation detecting unit 510 counts the number of times the clock signals output from the oscillator 12 attains the oscillation amplitude equal to or greater than a predetermined level at both the positive end and the negative end, and outputs a "High" signal if the count is equal to or greater than the predetermined value.

Figure 7:
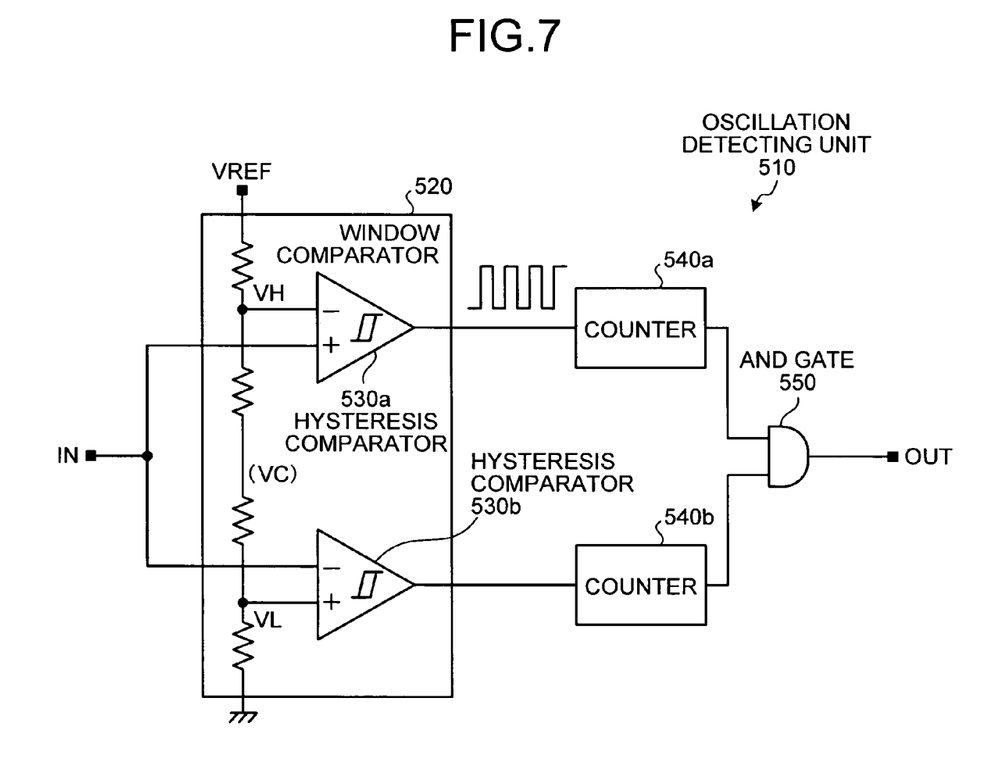
FIG. 7 is a functional block diagram of an oscillation detecting unit.

FIG. 7 is a functional block diagram of the oscillation detecting unit 510. The oscillation detecting unit 510 includes a window comparator 520, counters 540*a* and 540*b*, and an AND gate 550.

The window comparator 520 includes hysteresis comparators 530*a* and 530*b*, and determines whether the oscillation amplitude of the clock signals output from the oscillator 12 at the positive end and the negative end is equal to or greater than a predetermined level.

The hysteresis comparator 530*a* determines whether the oscillation amplitude of the input IN (the clock signals from the oscillator 12) at the positive end is greater than the threshold value VH, and if found to be greater than the threshold VH, outputs the clock signals to the counter 540*a*.

The hysteresis comparator 530*b* determines whether the oscillation amplitude of the input IN (the clock signals from the oscillator 12) at the negative end is less than the threshold value VL, and if found to be less than the threshold VL, outputs the clock signals to the counter 540*b*.

The counter 540*a* counts the number of clocks of the clock signals output from the hysteresis comparator 530*a*, and if the count is a specific value, outputs a "High" signal. The counter 540*b* counts the number of clocks of the clock signals output from the hysteresis comparator 530*b*, and if the number of clocks is a specific value, outputs a "High" signal.

The AND gate 550 outputs a "High" signal when the counters 540*a* and 540*b* output "High" signals, that is, when the clock signals output from the oscillator 12 are stabilized. When the oscillation takes place normally, and the oscillation amplitude is between VH and VL, either of the counters 540*a* and 540*b* arrives at the predetermined count value, and the oscillation detecting unit 510 determines that the oscillation of the clock signals is normal.

Thus, in the oscillation output circuit 500 according to the second embodiment, the oscillation detecting unit 510 counts the number of times the oscillation amplitude of the clock signals has exceeded a predetermined value once the power supply to the HDD is started, and if the count exceeds the predetermined value, outputs a "High" signal. When the oscillation detecting unit 510 outputs a "High" signal, the AND gate 142 outputs the clock signals output from the oscillator 12 to the HDC 14 if the input of the external reset signals has stopped and the output from the oscillation detecting unit 510 is "High". Consequently, the HDC 14 receives stable clock signals and can thus control the HDD without any malfunctioning.

The window comparator 520 according to the second embodiment is a hysteresis type comparator. When the peak detecting circuit 200 is used, just as the first embodiment, the peak detecting circuit 200 functions as a kind of lowpass filter, affording protection against noise.

However, if a hysteresis type comparator as in the second embodiment is not used and instead a counter type comparator without the peak detecting circuit is used, noise can easily get incorporated in the input signals, and even if there is no oscillation, pseudo clock signals are erroneously output from the comparator due to minute fluctuations near the threshold value. However, by using a hysteresis type comparator in the second embodiment, the problem of pseudo clock signals being output is addressed.

According to the second embodiment, the a large value is set as a setting of the counters 540*a* and 540*b*, thereby obviating the need for providing the delay circuit 130, as shown in FIG. 6. As a result the cost of the oscillation output circuit 500 can be reduced.

The oscillation output circuit according to the embodiments of the present invention is used in the HDC of the HDD. However, oscillation output circuit according to the embodiments of the present invention can also be used in an optical disk controller (ODC) built into an magneto optical (MO) drive, compact disk (CD)/digital versatile disk (DVD) drive, etc.

According to an embodiment of the present invention, it is determined whether clock signals output from an oscillator have attained an oscillation amplitude equal to or greater than a predetermined value, and the clock signals are output only if they satisfy the condition. Consequently, malfunctioning of the controller due to unstable clock signals and thereby failure of the device being controlled (for example, a recording device that performs data writing and reading), is prevented.

Furthermore, according to an embodiment of the present invention, control is realized by using the clock signals after a predetermined time has elapsed since the time the clock signals attain the oscillation amplitude equal to or greater than the predetermined value. Consequently, the device being controlled can be controlled more safely.

Moreover, according to an embodiment of the present invention, a count of the number of times the clock signals attain the oscillation amplitude equal to or greater than the predetermined value is kept, and if the count exceeds a predetermined value, it is determined that the clock signals have attained the oscillation amplitude equal to or greater than the predetermined value and the clock signals are output. Consequently, the device being controlled is properly controlled without causing any failure.

Furthermore, according to an embodiment of the present invention, it is determined whether the clock signals output from the oscillator have attained the oscillation frequency equal to or greater than the predetermined value, and if the condition is not satisfied, the clock signals are stopped. If the condition is satisfied, the control of the recording medium driving device is performed using the clock signals. Consequently, failure of the recording medium driving device can be prevented.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An output control device that controls an output of a clock signal generated by an oscillator, the output control device comprising:
   a determining unit that receives the clock signal generated by the oscillator and determines whether the clock signal has an amplitude equal to or greater than a predetermined value; and
   an output control unit that outputs the clock signal to an output destination when the determining unit determines that the clock signal has the amplitude equal to or greater than the predetermined value, and suspends the output of the clock signal to the output destination when the determining unit determines that the clock signal does not have the amplitude equal to or greater than the predetermined value, wherein the determining unit is configured to output a "High" signal if the determining unit determines that the clock signal has the amplitude equal to or greater than the predetermined value and a "Low" signal if the determining unit determines that the clock signal does not have the amplitude equal to or greater than the predetermined value,
   a first AND gate configured to receive the clock signal generated by the oscillator and the delayed "High" or "Low" signal from the delay circuit and output the clock signal received if the first AND gate receives the delayed "High" signal from the delay circuit;
   a second AND gate configured to output a "High" output signal if the second AND gate receives the delayed "High" signal from the delay circuit and a "high" reset signal: and
   a third AND gate as the output control unit configured to receive the clock signal from the first AND gate and output the clock signal received to the output destination if the third AND gate receives the "High" output signal from the second AND gate.

2. The output control device according to claim 1, wherein the output destination is a control device that controls a data storing device that performs at least one of data recording and data reading.

3. The output control device according to claim 2, farther comprising:
   an error output unit that outputs an error notification to the data storing device or a peripheral circuit when the clock signal is not oscillated with the amplitude equal to or greater than the predetermined value within a predetermined time from a time the oscillator starts outputting the clock signal.

4. The output control device according to claim 3, wherein the error output unit restarts the data storing device when the clock signal is not oscillated with the amplitude equal to or greater than the predetermined value within a predetermined time from a time the oscillator starts outputting the clock signal.

5. The output control device according to claim 1, wherein the output control unit outputs the clock signal to the output destination after a predetermined time has elapsed since starting of the oscillation of the clock signal with the amplitude equal to or greater than the predetermined value.

6. The output control device according to claim 1, wherein the determining unit counts number of times the clock signal is oscillated with the amplitude equal to or greater than the predetermined value, and when the count exceeds a predetermined number of times, determines that the clock signal is oscillated with the amplitude equal to or greater than the predetermined value.

7. A method comprising:
   receiving a clock signal generated by an oscillator;
   determining whether the clock signal has an amplitude equal to or greater than a predetermined value;
   outputting the clock signal to an output destination when the determining unit determines that the clock signal has the amplitude equal to or greater than the predetermined value, and suspends the output of the clock signal to the output destination when the determining unit determines that the clock signal does not have the amplitude equal to or greater than the predetermined value: outputting a "High" signal from the determining trait if the determining unit determines that the clock signal has the amplitude equal to or greater than the predetermined value and a "Low" signal if the determining unit determines that the clock signal does not have the amplitude equal to or greater than the predetermined value
   wherein an error output unit restarts a data storing device when the clock signal is not oscillated with the amplitude equal to or greater than the predetermined value within a predetermined time from a time the oscillator starts outputting the clock signal.
   receiving at a first AND gate the clock signal generated by the oscillator and the delayed "High" or "Low" signal from the delay circuit and outputting from the first AND gate the clock signal received if the first AND gate receives the delayed "High" signal from the delay circuit;
   outputting from a second AND gate a "High" output signal if the second AND gate receives the delayed "Hgh" signal from the delay circuit and a "High" reset signal; and
   receiving at a third AND gate as the output control unit the clock signal from the first AND gate and outputting from the third AND gate the clock signal received to the output destination if the third AND gate receives the "High" output signal from the second AND gate.

8. The method according to claim 7, wherein
the outputting includes outputting the clock signal to the output destination after a predetermined time has elapsed since starting of the oscillation of the clock signal with the amplitude equal to or greater than the predetermined value.

9. The method according to claim 7, wherein
the determining includes
counting number of times the clock signal is oscillated with the amplitude equal to or greater than the predetermined value; and
determining, when the count exceeds a predetermined number of times, that the clock signal is oscillated with the amplitude equal to or greater than the predetermined value.

10. The method according to claim 7, wherein
the output destination is a control device that controls a data storing device that performs at least one of data recording and data reading, and
the method further comprises outputting an error notification to the data storing device or a peripheral circuit when the clock signal is not oscillated with the amplitude equal to or greater than the predetermined value within a predetermined time from a time the oscillator starts outputting the clock signal.

11. A recording-medium-driver control device comprising:
a determining unit that receives a clock signal generated by an oscillator and determines whether the clock signal has an amplitude equal to or greater than a predetermined value;
an output control unit that outputs the clock signal to an output destination when the determining unit determines that the clock signal has the amplitude equal to or greater than the predetermined value, and suspends the output of the clock signal to the output destination when the determining unit determines that the clock signal does not have the amplitude equal to or greater than the predetermined value; and
a recording-medium-driver control unit that is controlled by the clock signal output from the output control unit,
wherein the determining unit is configured to output a "High" signal if the determining unit determines that the clock signal has the amplitude and a "Low" signal if the determining unit determines that the clock signal does not have the amplitude, and the recording-medium-driver control device further comprises:
a delay circuit configured to receive the "High" or "Low" signal from the determining unit and delay the "High" or "Low" signal for a predetermined time period;
a first AND gate configured to receive the clock signal generated by the oscillator and the delayed "High" or "Low" signal from the delay circuit and output the clock signal received if the first AND gate receives the delayed "High" signal from the delay circuit:
a second AND gate configured to output a "High" output signal if the second AND gate receives the delayed "High" signal from the delay circuit and a "High" reset signal; and
a third AND gate as the output control unit configured to receive the clock signal from the first AND gate and output the clock signal received to the output destination if the third AND gate receives the "High" output signal from the second AND gate.

12. An output control device that controls an output of a clock signal generated by an oscillator, the output control device comprising:
a determining unit that receives the clock signal generated by the oscillator and determines whether the clock signal has an amplitude equal to or greater than a predetermined value; and
an output control unit that outputs the clock signal to an output destination when the determining unit determines that the clock signal has the amplitude equal to or greater than the predetermined value,
wherein an error output unit restarts a data storing device when the clock signal is not oscillated with the amplitude equal to or greater than the predetermined value within a predetermined time from a time the oscillator starts outputting the clock signal.

* * * * *

UNITED STATES PATENT AND TRADEMARK OFFICE
CERTIFICATE OF CORRECTION

PATENT NO. : 7,599,140 B2
APPLICATION NO. : 11/439158
DATED : October 6, 2009
INVENTOR(S) : Tsuyama It is certified that error appears in the above-identified patent and that said Letters Patent is hereby corrected as shown below:

IN THE CLAIMS:

In Claim 7:

| | |
|---|---|
| Col. 10, line 18 | Delete "value:" and insert --value;-- in its place. |
| Col. 10, line 18 | Insert a new paragraph between "value;" and "outputting". |
| Col. 10, line 24 | After "value" insert a -- ; --. |
| Col. 10, line 25 | Delete the paragraph beginning with "wherein an error..." and replace it with the following paragraph: |

--receiving the "High" or "Low" signal at a delay unit from the determining unit and delaying at the delay unit the "High" or "Low" signal for a predetermined time period;--

Signed and Sealed this

Twelfth Day of January, 2010

David J. Kappos
*Director of the United States Patent and Trademark Office*